US011257678B2

(12) United States Patent
Takamatsu et al.

(10) Patent No.: US 11,257,678 B2
(45) Date of Patent: Feb. 22, 2022

(54) PLASMA PROCESSING METHOD

(71) Applicant: HITACHI HIGH-TECH CORPORATION, Tokyo (JP)

(72) Inventors: Tomohiro Takamatsu, Tokyo (JP); Takao Arase, Tokyo (JP); Hiroyuki Kajifusa, Tokyo (JP)

(73) Assignee: HITACHI HIGH-TECH CORPORATION, Tokyo (JP)

(*) Notice: Subject to any disclaimer, the term of this patent is extended or adjusted under 35 U.S.C. 154(b) by 0 days.

(21) Appl. No.: 16/642,311

(22) PCT Filed: Apr. 19, 2019

(86) PCT No.: PCT/JP2019/016735
§ 371 (c)(1),
(2) Date: Feb. 26, 2020

(87) PCT Pub. No.: WO2020/008703
PCT Pub. Date: Jan. 9, 2020

(65) Prior Publication Data
US 2020/0357650 A1  Nov. 12, 2020

(51) Int. Cl.
*H01L 21/3065* (2006.01)
*H01L 21/3213* (2006.01)

(52) U.S. Cl.
CPC .... *H01L 21/3065* (2013.01); *H01L 21/32137* (2013.01)

(58) Field of Classification Search
CPC ........... H01L 21/3065; H01L 21/31105; H01L 21/31116; H01L 21/31138; H01L 21/30621; H01L 21/31055; H01L 21/32137

USPC ....... 438/706, 710, 712, 714, 719, 723, 736, 438/758
See application file for complete search history.

(56) References Cited

U.S. PATENT DOCUMENTS

| 4,793,897 A | 12/1988 | Dunfield |
| 6,312,616 B1 | 11/2001 | Chinn et al. |
| 2007/0281477 A1 | 12/2007 | Lee et al. |
| 2008/0090418 A1 | 4/2008 | Jeon et al. |

(Continued)

FOREIGN PATENT DOCUMENTS

| JP | 200821975 A | 1/2008 |
| JP | 2008103718 A | 5/2008 |

(Continued)

OTHER PUBLICATIONS

International Search Report issued in PCT/JP2019/016735 dated Jun. 14, 2019.

(Continued)

*Primary Examiner* — Lan Vinh
(74) *Attorney, Agent, or Firm* — Miles & Stockbridge, P.C.

(57) ABSTRACT

The invention has been made in view of the above problems, and provides a plasma processing method capable of preventing etching shape abnormality in a plasma processing method for forming a mask layer of a polysilicon film. The invention relates to a plasma processing method for plasma-etching a polysilicon film, the plasma processing method comprising plasma-etching the polysilicon film using a mixed gas including a halogen gas, a fluorocarbon gas, an oxygen gas, and a carbonyl sulfide gas.

8 Claims, 7 Drawing Sheets

(56) References Cited

U.S. PATENT DOCUMENTS

| | | |
|---|---|---|
| 2010/0140688 A1 | 6/2010 | Fujimoto |
| 2011/0151670 A1 | 6/2011 | Lee |
| 2014/0120727 A1 | 5/2014 | Subramanian et al. |
| 2015/0011094 A1 | 1/2015 | Narishige et al. |
| 2015/0122422 A1 | 5/2015 | Hayasaka et al. |
| 2015/0255305 A1* | 9/2015 | Nakagawa ........ H01J 37/32697 438/714 |
| 2015/0340243 A1* | 11/2015 | Kikuchi ............ H01L 21/31116 438/700 |
| 2016/0307764 A1 | 10/2016 | Gupta et al. |
| 2016/0314981 A1 | 10/2016 | Yoon et al. |
| 2017/0352546 A1 | 12/2017 | Gupta et al. |
| 2018/0076046 A1* | 3/2018 | Shen ................. H01L 21/30655 |
| 2018/0082861 A1* | 3/2018 | Citla ................. H01J 37/32706 |
| 2018/0122651 A1 | 5/2018 | Ishimaru et al. |
| 2018/0286707 A1* | 10/2018 | Hudson ............. H01J 37/32422 |
| 2018/0342401 A1* | 11/2018 | Koiwa .............. H01L 21/31122 |

FOREIGN PATENT DOCUMENTS

| | | |
|---|---|---|
| JP | 201550229 A | 3/2015 |
| JP | 201590897 A | 5/2015 |
| JP | 2016529740 A | 9/2016 |
| JP | 201874006 A | 5/2018 |
| KR | 20010080689 A | 8/2001 |
| KR | 100790999 B1 | 1/2008 |
| KR | 100945226 B1 | 3/2010 |
| KR | 20140120309 A | 10/2014 |
| WO | 2013118660 A1 | 8/2013 |

OTHER PUBLICATIONS

Office Action dated May 31, 2021 in Korean Application No. 10-2019-7037110.

Office Action dated Mar. 27, 2018 for Taiwanese Application No. 106127962.

\* cited by examiner

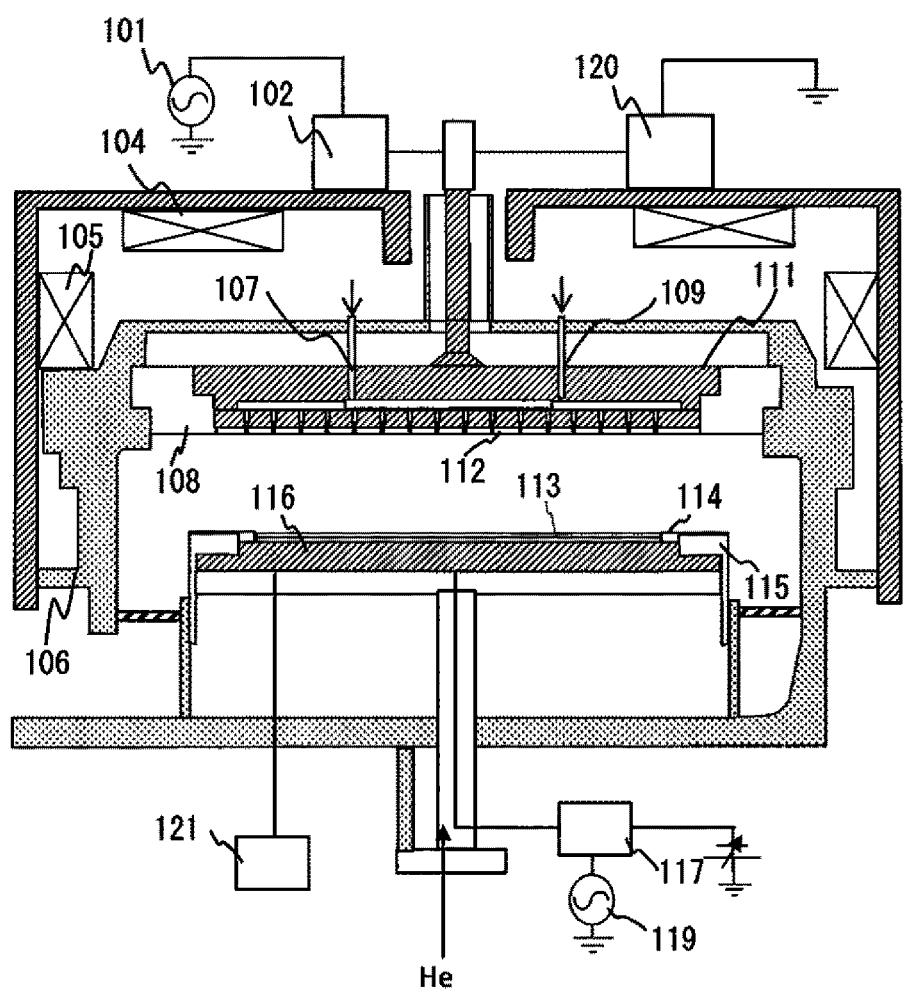
[FIG. 1]

[FIG. 2]
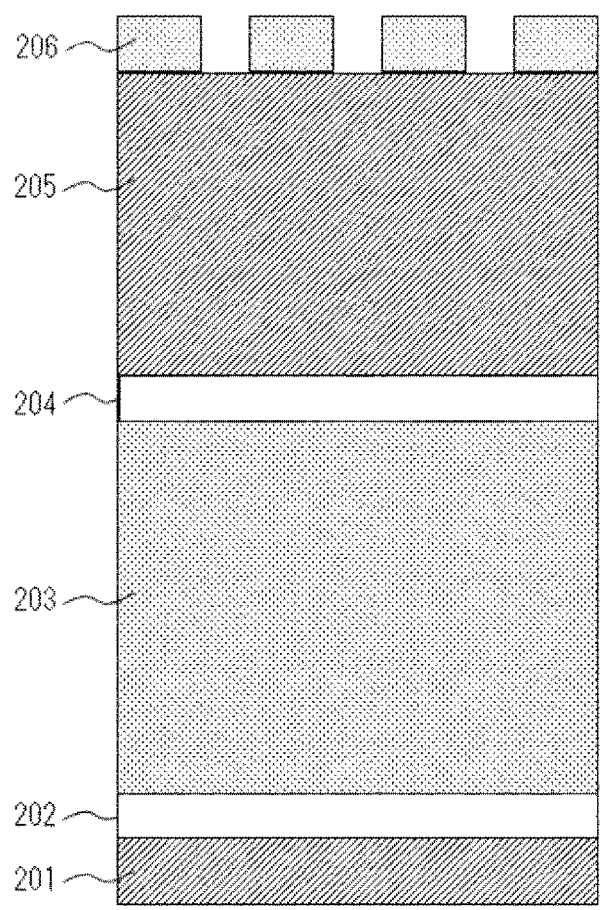

[FIG. 3]
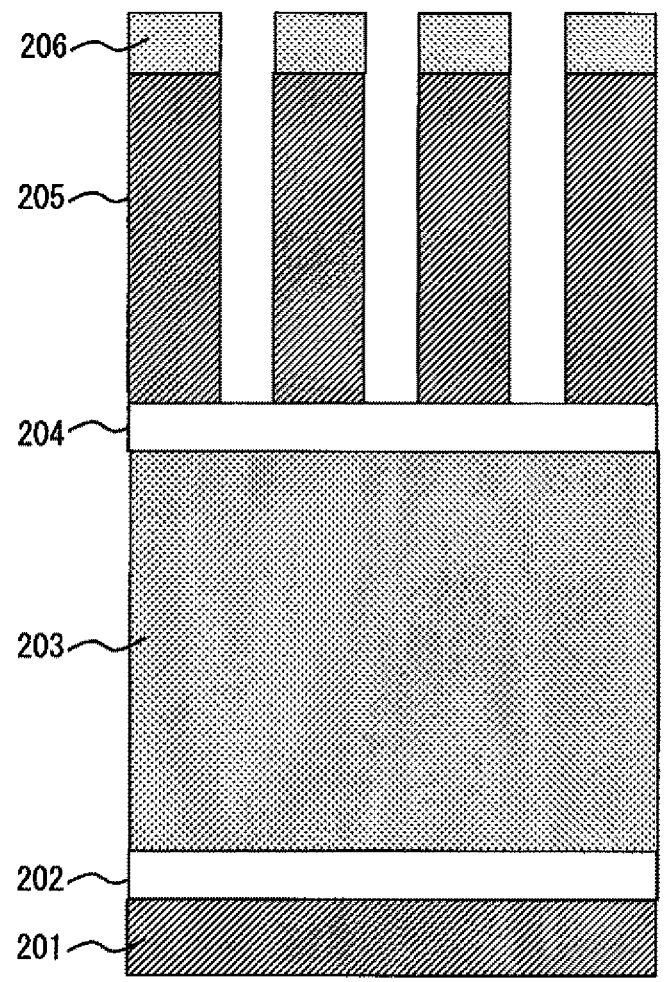

[FIG. 4]
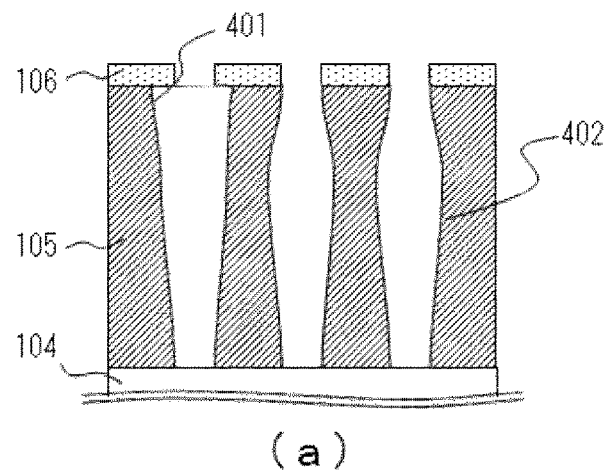
(a)
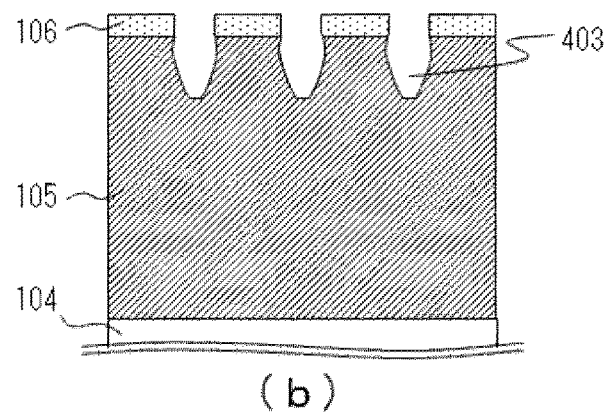
(b)
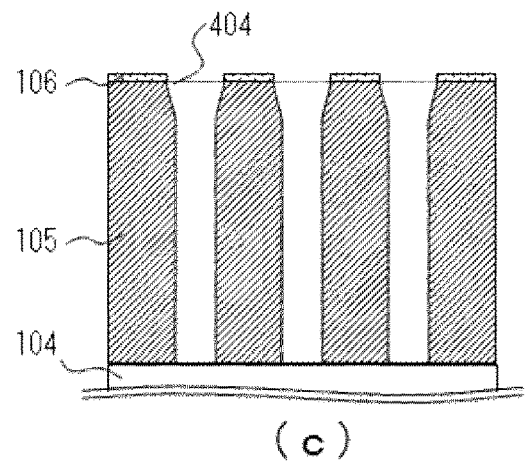
(c)

[FIG. 5]
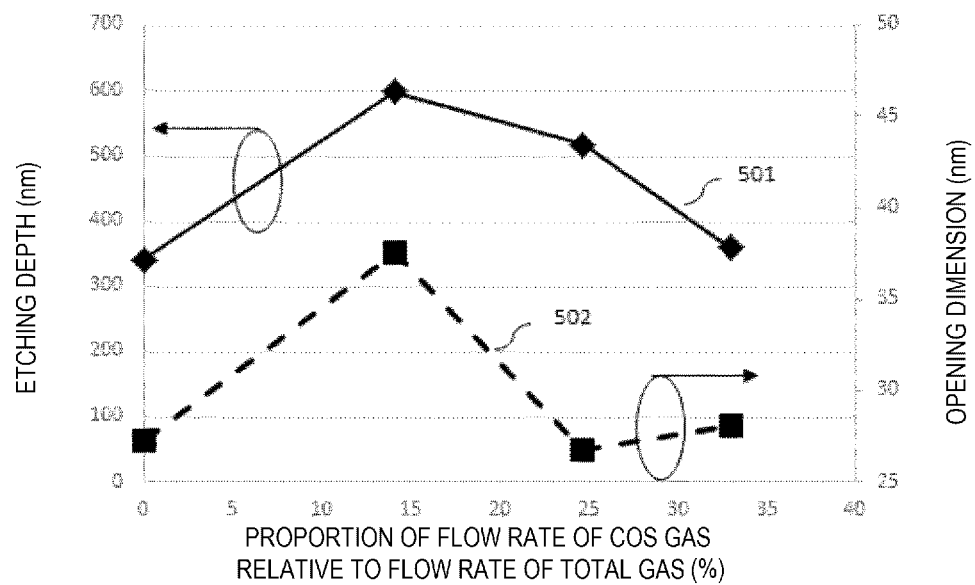
[FIG. 6]
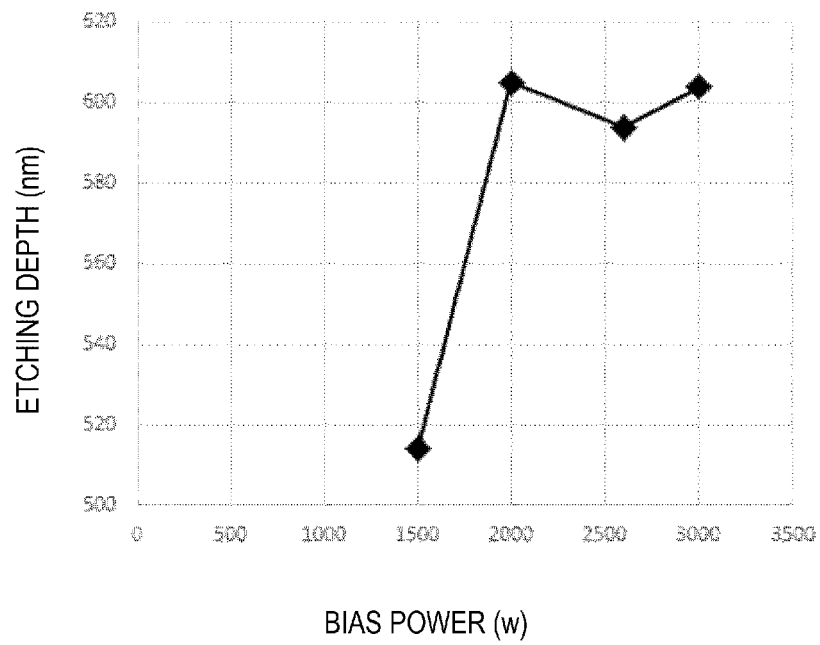

[FIG. 7]
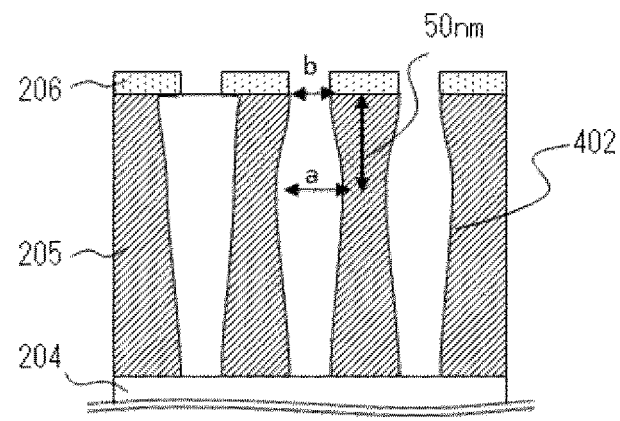
BOWING DIMENSION = a-b
(a)
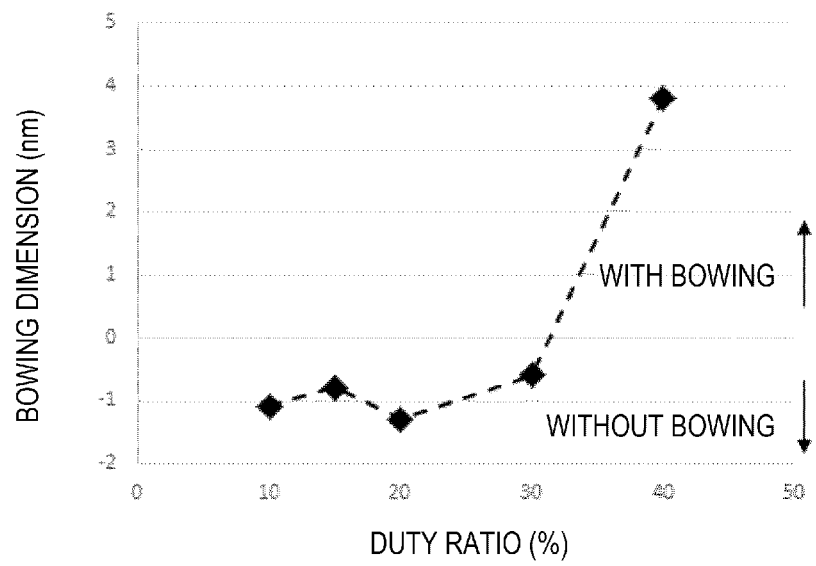
(b)

[FIG. 8]
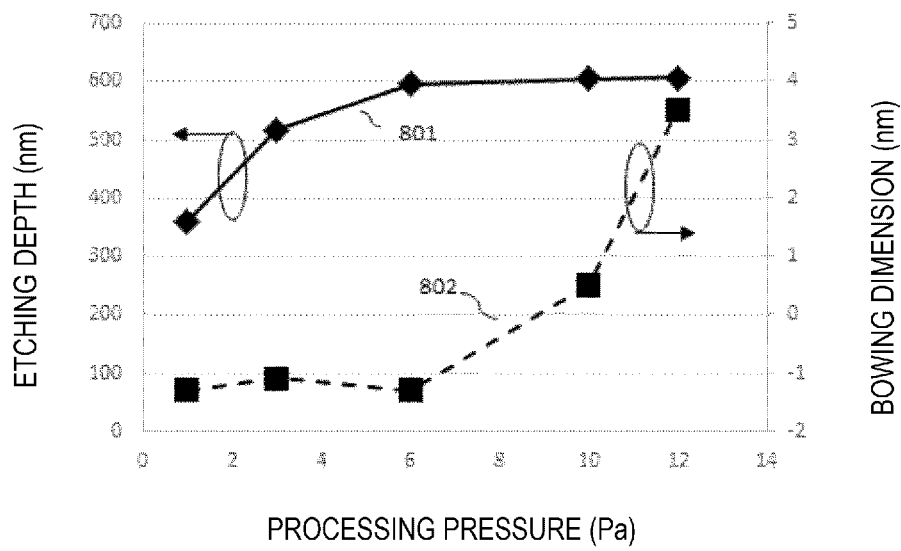
[FIG. 9]
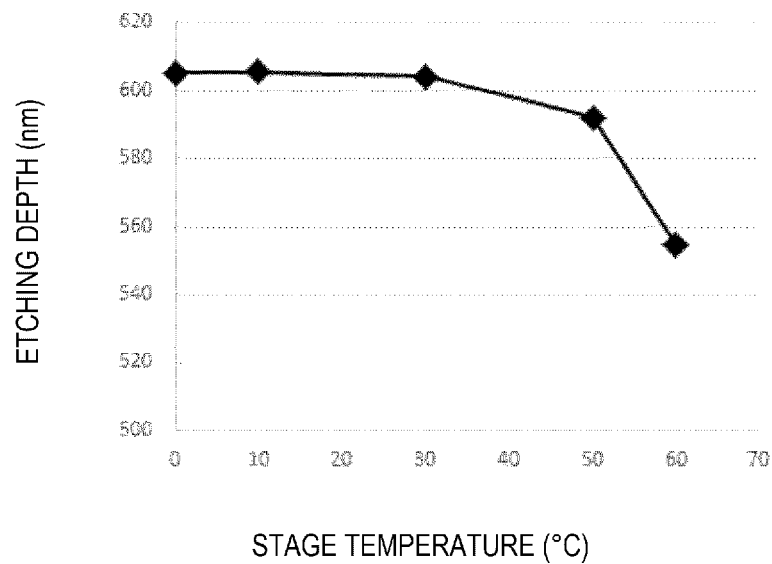

PLASMA PROCESSING METHOD

TECHNICAL FIELD

The present invention relates to a dry etching method using plasma relating to semiconductor manufacturing.

BACKGROUND ART

In a dynamic random access memory (DRAM) or a 3D-NAND flash memory, a deep hole shape or a deep groove shape may be formed along with high integration, and dry etching using plasma is used for the formation.

In the related art, a photoresist film is used as a mask layer in order to form a hole or groove shape, but the photoresist film disappears during the dry etching as the hole or groove shape becomes deeper, so that a desired shape cannot be obtained. Therefore, a deep hole shape or a deep groove shape is formed by dry etching using a polysilicon film having dry etching resistance as the mask layer. In addition, when the deep hole shape or the deep groove shape is to be formed, the mask layer is formed into a thick film so as not to disappear during the dry etching, and the deep hole shape or the deep groove shape is also formed on the mask layer by the dry etching.

As a plasma etching method for forming a deep groove in a silicon substrate, PTL 1 discloses a plasma etching method for forming a trench isolation structure including a sparse-dense pattern on the silicon substrate, in which a HBr gas is used as a main component, and a mixed gas is used in which an $O_2$ gas and an oxygen-containing gas different from the $O_2$ gas, such as a $CO_2$ gas or a $SO_2$ gas, are added.

CITATION LIST

Patent Literature

PTL 1: JP-A-2015-050229

SUMMARY OF INVENTION

Technical Problem

As an aspect ratio (A/R) indicating a ratio of an etching depth to an opening dimension of a pattern, it is necessary to form a deep hole shape or a deep groove shape having an aspect ratio of 20 or more on the mask layer along with the high integration of the dynamic random access memory (DRAM) or the 3D-NAND flash memory. In the technique in the related art, for example, when the mask layer of the polysilicon film and having a high aspect ratio is etched by the method disclosed in PTL 1, the opening dimension is increased by etching.

Therefore, etching shape abnormality that adjacent patterns are connected occurs. In addition, when the mask layer is etched while being protected by a deposit film or the like to prevent the opening dimension from increasing, etching stop occurs during the etching, and the desired deep hole shape or deep groove shape cannot be formed.

Here, the invention has been made in view of the above problems, and provides a plasma processing method capable of preventing the etching shape abnormality in a plasma processing method for forming a mask layer of the polysilicon film.

Solution to Problem

The invention relates to a plasma processing method for plasma-etching a polysilicon film, the plasma processing method including plasma-etching the polysilicon film using a mixed gas includes a halogen gas, a fluorocarbon gas, an oxygen gas, and a carbonyl sulfide gas.

Advantageous Effect

According to the invention, etching shape abnormality can be prevented in a plasma processing method for forming a mask layer of the polysilicon film.

BRIEF DESCRIPTION OF DRAWINGS

FIG. 1 is a vertical cross-sectional view of a plasma etching device for implementing one embodiment.

FIG. 2 is a schematic diagram before etching a mask layer of a DRAM element portion.

FIG. 3 is a schematic diagram after a polysilicon film 205 is plasma-etched.

FIG. 4 shows schematic diagram s showing shape abnormality.

FIG. 5 is a graph showing a relationship between a proportion of a flow rate of a COS gas relative to a flow rate of a total gas and an etching depth, and a relationship between the proportion of the flow rate of the COS gas relative to the flow rate of the total gas and an opening dimension.

FIG. 6 is a graph showing a relationship between a bias power and an etching depth.

FIG. 7 shows a diagram showing a definition of a bowing dimension and a graph showing a relationship between a duty ratio and the bowing dimension.

FIG. 8 is a graph showing a relationship between a processing pressure and an etching depth and a relationship between the processing pressure and the bowing dimension.

FIG. 9 is a graph showing a relationship between a stage temperature (temperature of a sample stage) and an etching depth.

DESCRIPTION OF EMBODIMENTS

The invention will be described below with reference to FIGS. 1 to 9. FIG. 1 is a vertical cross-sectional view of a parallel plate type magnetic field VHF dry etching device. A vacuum vessel in the dry etching device includes an etching chamber 106 as a plasma processing chamber, a VHF radiation antenna 111, and a vacuum pump and a pressure control valve (both are not shown in FIG. 1).

Etching gases are introduced into the etching chamber 106 concentrically with a shower plate 112 respectively through a gas introduction port A 107 and a gas introduction port B 109 after passing through a mass flow controller (MFC) and a stop valve (both are not shown in FIG. 1). Then, the gas is exhausted, from an exhaust port provided at a bottom of the device, by a turbo molecular pump and a dry pump (both are not shown in FIG. 1). The gas introduced in this way is dissociated by energy of an electromagnetic wave emitted by a plasma generation unit, so that plasma is generated and maintained.

The plasma generation unit includes a source power supply 101 for a VHF wave of 200 MHz, a source electromagnetic wave matcher 102, an electromagnet A 104, and an electromagnet B 105. The two electromagnets are used to make a plasma generation distribution uniform. The generated magnetic field is 10 mT or less near the shower plate 112.

A wafer stage 116 as a sample stage on which a wafer 113 as a sample is disposed includes a ring-shaped focus ring 114 disposed to cover an outer peripheral side and side walls of a placement surface of the wafer 113 and a susceptor 115. A plurality of portions of the wafer stage 116 can be controlled to different predetermined temperatures by using a plurality of stage temperature control units 121.

An RF bias power supply 119 of 4 MHz, for controlling ion energy for drawing ions from the plasma to the wafer 113 and an RF bias matcher 117 are connected to the wafer stage 116. The RF bias power supply 119 can output, to an object to be processed having a diameter of 12 inches, a power of about at least 100 W to a maximum power of about 6 kW corresponding to a continuous sine wave. In addition, a bias path control mechanism 120 for controlling a proportion of a bias current that passes the plasma to the VHF radiation antenna 111 is provided, so that the distribution of the plasma can be controlled with higher accuracy.

Next, a cross-sectional structure of a semiconductor wafer to which the invention is applied using the etching device shown in FIG. 1 is shown in FIG. 2. A silicon nitride film 202 (SiN), a silicon oxide film 203 ($SiO_2$), a silicon nitride film 204 (SiN), a polysilicon film 205 (Poly-Si), and a silicon oxide film 206 ($SiO_2$) are formed in order from the bottom from a wafer substrate 201 (Si). Further, a thickness of the polysilicon film 205 (Poly-Si) is 500 nm to 1500 nm, and a thickness of the silicon oxide film 206 ($SiO_2$) is 150 nm to 300 nm.

Next, an etching processing for the semiconductor wafer having the structure shown in FIG. 2 will be described.

First, as shown in FIG. 2, a pattern is transferred to an anti-reflection film (not shown) and the silicon oxide film 206 by etching using a photoresist film (not shown) having a pattern exposed thereon as a mask. Then, the photoresist film and the anti-reflection film are removed by asking.

Subsequently, as shown in FIG. 3, the polysilicon film 205 is etched using the silicon oxide film 206 as the mask. First, a case where a fluorocarbon gas ($CHF_3$) is added to a mixed gas including a $Cl_2$ gas and an $O_2$ gas is described as a comparative example. The tendencies of respective gases are as follows.

First, when a proportion of a flow rate of the $Cl_2$ gas relative to a flow rate of the total gas is high, the supply of Cl radicals becomes excessive, and as shown in FIG. 4(a), side etching 401 and bowing 402 occur in the polysilicon film 205. In addition, when the proportion of the flow rate of the $Cl_2$ gas is low, as shown in FIG. 4(b), etching does not proceed and etch stop 403 occurs. When a proportion of a flow rate of the $CHF_3$ gas relative to the flow rate the total gas is high, the silicon oxide film 206 as the mask layer is etched as shown in FIG. 4(C), so that the mask layer regresses, and as the etching proceeds, an enlargement 404 occurs in an opening.

In addition, the $CHF_3$ gas is deposited as a CF-based polymer film with respect to polysilicon. With this deposition, side surfaces of the polysilicon are protected and the side etching 401 and the bowing 402 can be prevented. However, when a deposition amount is too large, the etching does not proceed, and the etch stop 403 occurs. When the proportion of the flow rate of the $CHF_3$ gas is low, the protection for side walls of the polysilicon is weakened due to the deposition of the polymer film, and the side etching 401 and the bowing 402 occur.

When a proportion of a flow rate of oxygen gas ($O_2$) relative to the flow rate of the total gas is high, a surface of the polysilicon is oxidized, so that the side etching 401 and the bowing 402 can be prevented. However, when an oxidation amount is too large, the etching does not proceed, and the etch stop 403 occurs. In addition, when the propor-tion of the flow rate of oxygen gas ($O_2$) is low, the oxidation of the surface of the polysilicon is weakened, and the side etching 401 and the bowing 402 occur.

In addition, when the etching method disclosed in PTL 1 is used to form a deep hole shape or a deep groove shape in a mask layer having a high aspect ratio of 20 or more along with high integration of the semiconductor device as described above, a problem 404 occurs in which an opening dimension is enlarged as the etching proceeds. Therefore, in the invention, a mixed gas including a halogen gas, a fluorocarbon gas, an oxygen gas, and a carbonyl sulfide gas is used. The effect of the carbonyl sulfide gas (COS) is as follows.

The COS gas is dissociated into CO and S in the plasma. When a proportion of a flow rate of the COS gas relative to the flow rate of the total gas is low, the CF-based polymer film formed by $CHF_3$ is removed as COF or $COF_2$ from the surface by the CO obtained by dissociation, so that the etching proceeds and the etch stop 403 is prevented. In addition, an oxide film on the surface of the polysilicon formed by the oxidation by the oxygen gas ($O_2$) is removed as $CO_2$ from the surface by the CO obtained by dissociation, so that the etching proceeds, and the etch stop 403 is prevented similarly.

Further, when the proportion of the flow rate of the carbonyl sulfide gas (COS) is high, the S obtained by dissociation is formed into a strong C—S bond having a binding energy higher than that of a C—F bond in the CF-based polymer film, so that the side etching 401 and the bowing 402 are prevented. In addition, since the COS gas does not contain halogen atoms, an etching rate for the silicon oxide film 206 of the mask layer is slow, and the etching can proceed while preventing the enlargement 404 of the opening due to the regression of the mask layer.

On the other hand, when the proportion of the flow rate of the carbonyl sulfide gas (COS) is too high, the deposition amount of the polymer film including the C—S bond increases, so that the etching does not proceed, and the etch stop 403 occurs. FIG. 5 shows the dependence of an etching depth 501 and an opening dimension 502 as well as the proportion of the flow rate of the COS gas relative to the flow rate of the total gas. Here, the etching depth indicates a degree of the progress of the etching. It is to be noted that an etching processing time is constant under all conditions.

As shown in FIG. 5, when the proportion of the flow rate of the COS gas relative to the flow rate of the total gas is 0%, that is, when the flow rate of the COS gas is 0 ml/min, the etching depth is about 340 nm while the opening dimension is about 27 nm. In addition, when the proportion of the flow rate of the COS gas is 15%, the opening dimension is enlarged as compared with the case of 0% and is about 38 nm, but the etching depth is about 600 nm, and the etching proceeds. Further, when the proportion of the flow rate of the COS gas is 25%, the opening dimension is about 27 nm, which is the same as the case of 0%, but the etching depth is about 520 nm and the etching proceeds to some extent as compared with the case of 15%.

When the proportion of the flow rate of the COS gas is 35%, the opening dimension is about 27 nm, the etching depth is about 360 nm, and the etching proceeds more slowly than that in the case of 25%. Therefore, it can be seen that it is desirable to set the proportion of the flow rate of the COS gas relative to the flow rate of the total gas to a range of 15% to 35% in order to allow the etching to proceed without increasing the opening dimension. Therefore, in the present embodiment, the flow rate of the $Cl_2$ gas is 20 ml/min, the flow rate of the $CHF_3$ gas is 75 ml/min, the flow rate of the $O_2$ gas is 65 ml/min, and the flow rate of the COS gas is 47 ml/min.

In addition, an etching shape can be controlled with higher accuracy by controlling the above flow rates of the gases and a time modulation bias (hereinafter referred to as TM bias) in which a bias power supply and a bias On/Off are periodically repeated in an order of milliseconds. Here, a proportion of an ON period of the TM bias relative to a cycle is defined as a duty ratio. Further, the TM bias is assumed to supply pulse-modulated radio frequency power to the sample stage.

FIG. 6 is a graph showing a relationship between a bias power and an etching depth. Here, for each bias power, the duty ratio in each bias power is set such that a product of the bias power and the duty ratio is constant. As shown in FIG. 6, it can be seen that the etching depth is small at a bias power of 2000 W or less. Based on this result, in order to proceed the etching in a short time, it is desirable to set the power supply of the bias power source to be 2000 W or more. At this time, since a peak-to-peak voltage (Vpp) of a sine wave of 4 MHz at 2000 W is 1800 V, when a bias frequency is different, it is possible to adjust the Vpp by controlling a supply power corresponding to the Vpp to be 1800 V or more, or controlling the Vpp to be 1800 V or more.

The TM bias can obtain a desired processing shape by effectively utilizing the normal incidence property of ions during an ON period and the reactivity of the ions in an OFF period. FIG. 7(b) shows a relationship between the duty ratio and a bowing dimension. Here, the bowing dimension is obtained by subtracting a dimension (b) from a dimension (a) 50 nm under the opening as shown in FIG. 7(a).

As shown in FIG. 7(b), when the duty ratio is 40% or more, the bowing dimension is a positive value, indicating that the bowing 402 occurs. When the duty ratio is 40% or more, the deposition of the CF-based polymer film on the surface of the polysilicon is reduced, and the side etching 401 and the bowing 402 proceed. On the other hand, when the duty ratio is 10% or less, the supply amount of the ions is reduced, and the proceeding of the etching is delayed. Therefore, it is desirable to set the duty ratio of the TM bias to 10% to 40%. By setting the duty ratio as described above, the enlargement 404 in the opening dimension, the side etching 401, and the bowing 402 can be prevented.

Next, a processing pressure will be described. FIG. 8 is a graph showing a relationship between the processing pressure and an etching depth 801 and a relationship between the processing pressure and a bowing dimension 802. As shown in FIG. 8, when the processing pressure is 3 Pa or less, an amount of radicals decreases, and the proceeding of the etching is delayed. In addition, when the processing pressure is 10 Pa or more, there is a problem that the bowing dimension is enlarged due to a shortening in an average free step. Based on these results, it is desirable to set the processing pressure to a pressure in a range of 3 Pa to 10 Pa.

Next, a stage temperature (temperature of the sample stage) during the processing will be described. FIG. 9 is a graph showing a relationship between the stage temperature (temperature of the sample stage) and the etching depth during processing. As shown in FIG. 9, when the stage temperature is 50° C. or higher, a deposition speed of the CF-based polymer film is slow, so that the protection for side surfaces of the hole or the groove is insufficient, and the etching depth is small due to the consumption of Cl radicals in the formation of the side etching 401 and the bowing 402. On the other hand, when the stage temperature is 50° C. or lower, the CF-based polymer film protects the side surfaces of the hole or the groove shape, so that the Cl radicals are not consumed in the formation of the side etching 401 and the bowing 402. Thus, it is easier for the Cl radicals to reach a bottom of the hole or groove shape, and the etching depth becomes deeper. Based on these results, the stage temperature is preferably 50° C. or lower.

By appropriately adjusting the flow rates of the $Cl_2$ gas, the $CHF_3$ gas, the $O_2$ gas, and the COS gas and other parameters as described above, the etching of the polysilicon film 205 can be proceeded while preventing the enlargement 404 in the opening dimension, the side etching 401, and the bowing 402.

After the etching of the polysilicon film 205, the silicon nitride film 204 (SiN), the silicon oxide film 203 ($SiO_2$), and the silicon nitride film 202 (SiN) are sequentially etched using the polysilicon film 205 as a mask, so as to form the hole or the groove in the wafer substrate 201.

Above, according to the present embodiment, etching shape abnormality can be prevented in a plasma processing method in which the mask layer of the polysilicon film is formed and a film to be etched is plasma-etched by using the mask layer of the formed polysilicon film.

Although the $Cl_2$ gas is used as the halogen gas in the present embodiment, it is also possible to obtain the same effect as that of the present embodiment by using an HBr gas, a $NF_3$ gas, or a $SF_6$ gas other than the $Cl_2$ gas, or a combination of the $Cl_2$ gas, the HBr gas, the $NF_3$ gas, and the $SF_6$ gas.

Further, although the $CHF_3$ gas is used as the fluorocarbon gas in the present embodiment, it is possible to obtain the same effect as that of the present embodiment by using a $CF_4$ gas, a $C_4F_8$ gas, a $C_5F_8$ gas, a $C_4F_6$ gas, a $CH_2F_2$ gas, or a $CH_3F$ gas other than the $CHF_3$ gas. Further, even when the etching gas is diluted with an inert gas such as a $N_2$ gas, an Ar gas, a He gas, a Xe gas, or a Kr gas, it is possible to obtain the same effect as that of the present embodiment.

Further, in order to prevent the side etching 401 and the bowing 402, a cycle etching may be performed in which a protection step using the oxygen gas ($O_2$) and a dry etching step of the present embodiment are alternately performed. Further, regardless of the presence or absence of the cycle etching, the proportion of the flow rate of the carbonyl sulfide gas (COS) relative to the flow rate of the total gas in the dry etching step may be increased or decreased in a range of 15% to 35%.

Further, the proportion of the flow rate of the carbonyl sulfide gas relative to the flow rate the total gas may be gradually decreased in accordance with the proceeding of etching of the polysilicon film 205. In this case, the timing at which the proportion of the flow rate of the carbonyl sulfide gas is decreased may be decreased for each step, or may be continuously decreased in one step.

Further, although an example in which the VHF etching device of the parallel plate structure shown in FIG. 1 is used has been described in the present embodiment, it is possible to obtain the same effect as that of the present embodiment even in a plasma etching device using another plasma source such as capacitively coupled plasma (CCP), inductively coupled plasma (ICP), and microwave electron cyclotron resonance (ECR).

Although the silicon oxide film 206 is used as the mask layer in the present embodiment, a silicon oxynitride film, a metal film, or an amorphous carbon film may be used together with the polysilicon film in the mask layer instead of the silicon oxide film 206.

As described above, according to the invention, a desired deep hole shape or deep groove shape can be formed without enlarging the opening dimension in the dry etching method for forming the deep hole shape or the deep groove shape having a high aspect ratio of 20 or more in the polysilicon film.

REFERENCE SIGN LIST

101: source power supply
102: source electromagnetic wave matcher
104: electromagnet A
105: electromagnet B
106: etching chamber
107: gas introduction port A
109: gas introduction port B
111: VHF radiation antenna
112: shower plate
113: wafer
114: focus ring
115: susceptor
116: wafer stage
117: RF bias matcher
119: RF bias power supply
120: bias path control mechanism
121: stage temperature control unit
201: wafer substrate
202: silicon nitride film
203: silicon oxide film
204: silicon nitride film
205: polysilicon film
206: silicon oxide film

The invention claimed is:

1. A plasma processing method for plasma-etching a polysilicon film, the plasma processing method comprising:
   plasma-etching the polysilicon film using a mixed gas of a halogen gas, a fluorocarbon gas, an oxygen gas, and a carbonyl sulfide gas,
   wherein the halogen gas is a $Cl_2$ gas or a HBr gas,
   wherein a silicon oxide film is a mask material for forming a hole or a groove in the polysilicon film layer to be etched, and
   wherein the silicon oxide film does not extend into the polysilicon film etched layer.

2. The plasma processing method according to claim 1, wherein
   the fluorocarbon gas is at least one gas selected from a $CHF_3$ gas, a $CF_4$ gas, a $C_4F_8$ gas, a $C_5F_8$ gas, a $C_4F_6$ gas, a $CH_2F_2$ gas, and a $CH_3F$ gas.

3. The plasma processing method according to claim 1, wherein
   a proportion of a flow rate of the carbonyl sulfide gas relative to a flow rate of the mixed gas is a value in a range of 15% to 35%.

4. The plasma processing method according to claim 1, wherein
   a pressure in a processing chamber in which the polysilicon film is plasma-etched is set to a pressure in a range of 3 Pa to 10 Pa.

5. The plasma processing method according to claim 1, wherein
   a temperature of a sample stage placed with a sample on which the polysilicon film is formed is set to 50° C. or lower.

6. The plasma processing method according to claim 1, wherein
   the fluorocarbon gas is a $CHF_3$ gas.

7. The plasma processing method according to claim 1, wherein
   the polysilicon film is plasma-etched while supplying a radio frequency power of 2000 W or more to a sample stage placed with a sample on which the polysilicon film is formed, or while applying a peak-to-peak radio frequency voltage of 1800 V or more to the sample stage.

8. The plasma processing method according to claim 7, wherein
   the radio frequency power is subjected to pulse modulation, and
   a value of a duty ratio of the pulse modulation is in a range of 10% to 40%.

* * * * *